United States Patent [19] [11] 4,224,605
Michaud et al. [45] Sep. 23, 1980

[54] ANALOG-DIGITAL CODER COMPRISING A CHARGE TRANSFER DEVICE

[75] Inventors: Claude Michaud; Sylvain Fontanes, both of Paris, France

[73] Assignee: Thomson-CSF, Paris, France

[21] Appl. No.: 963,140

[22] Filed: Nov. 22, 1978

[30] Foreign Application Priority Data

Nov. 11, 1977 [FR] France .................. 77 35776

[51] Int. Cl.² .......................................... H03K 13/02
[52] U.S. Cl. ........................................... 340/347 AD
[58] Field of Search ................. 340/347 M, 347 AD

[56] References Cited
U.S. PATENT DOCUMENTS

| 3,903,543 | 9/1975 | Smith | 340/347 AD |
| 4,087,812 | 5/1978 | Terman | 340/347 AD |
| 4,129,863 | 12/1978 | Gray | 340/347 AD |

Primary Examiner—Charles D. Miller
Attorney, Agent, or Firm—Cushman, Darby & Cushman

[57] ABSTRACT

An analog-digital coder applicable for the coding of analog information in accordance with non-linear functions of compression such as the laws A and $\mu$ as set forth in the standards of the CCITT (International Telegraph and Telephone Consultative Committee). For non-linear coding the analog information is applied to an analog switch whose output signals are applied to an adder which also receives the output voltage of an amplifier. The output voltage of the adder is applied to a multiplier-analog memory which comprises a charge transfer device. Their output is coupled to the input of the amplifier. A comparator compares the output voltage of the multiplier-memory with a given voltage and controls a logic switching circuit which generates the coded output signal.

9 Claims, 7 Drawing Figures

Fig_1

Fig_2

Fig-3

ANALOG-DIGITAL CODER COMPRISING A CHARGE TRANSFER DEVICE

BACKGROUND OF THE INVENTION

1. Field of the Invention

The present invention relates to analog-digital coders and, in particular, to coders conforming to the compression laws A and $\mu$ defined in the standards of the CCITT (International Telegraph and Telephone Consultative Committee).

2. Description of the Prior Art

In order to code an analog signal in a series of bits, conventional coders generally effect the sequential operations of sampling the analog signal, quantifying and coding the sample in binary form. The coding establishes a one-to-one correspondence between the values quantified and their expression in binary form. Generally speaking, the conversion time of such devices is proportional to the sum of the sequential operations mentioned above. The times corresponding to the operations of quantifying and coding the samples signal increase as the complexity of the circuits enabling their execution increase.

These coders have been improved by means of charge transfer devices (hereinafter CTD) which enable the sampling operation to be effected better and more rapidly (elimination of a capacitor used as a memory), thus improving the conversion time.

The known solution is to use coders of the pulse type or successive approximation type (trial and error).

However, pulse coders require CTD's with a very large number of electrodes, this number limiting the conversion speed. They also require a very rapid comparator, with a very low threshold voltage and high dynamic performance; such a comparator is difficult to design. In the case of successive approximation coders, it is necessary, for each bit tested, to record it in the CTD and then to erase it, which also has the disadvantage of limiting conversion time (even if there are fewer electrodes than the minimum required for coders). Furthermore, the structure is still complex.

Analog-digital coders of the serial type are also known wherein coding is based on successive comparisons of the voltage to be coded in relation to fractions of a reference voltage, each successive comparison furnishing a bit corresponding to the analog voltage for coding, from the most significant bit to the least significant bit. Among others these different operations necessitate the use of multipliers as well as the storage of the results. These simply structured coders use capacitors for storing the results, which limits the conversion speed (owing to the time constant for charging and discharging the capacitors) as well as precision (since the leakage of the capacitors is not negligible with relatively long storage times).

SUMMARY OF THE INVENTION

The object of the present invention is to remedy the disadvantages of these known coders (complexity and long conversion time) by using the simple structure of a serial coder wherein a CTD enables the disadvantages due to capacitor memories to be eliminated.

According to the invention, there is provided an analog-digital coder intended for the coding of analog information in accordance with a law determining a compression curve constituted by p linear segments, p being a positive integer, each of said segments being quantified in a given number of quanta. Each analog information is coded in a number of $M=1+n+k$ bits characterizing each of said quanta, wherein n (integer greater than $-1$) is the number of bits whose value characterizes one of the p segments, k (positive integer) is the number of bits whose value characterises a quantum of the segment determined by n, and 1 corresponds to a bit of sign, said coder having an output and including in series: analog switching means having two inputs for receiving respectively said analog information and a first reference voltage, and two outputs; and adder having two inputs respectively coupled to the two outputs of said analog switching means; multiplication and storage means comprising a charge transfer device with $k+1$ groups of m cells (m positive integer), each cell being constituted by q electrodes (q integer greater than 1 and less than 4) having surfaces which are weighted by a factor that is a function of said law; a comparator for comparing the signal of the multiplication and storage means with a second reference voltage; and logic switching means having an output coupled to the output of said coder.

BRIEF DESCRIPTION OF THE DRAWING

The invention will be more readily understood and other features will become apparent through the description and the attached figures, wherein:

FIG. 3 is a diagram of a first embodiment of a device according to the invention;

DESCRIPTION OF THE PREFERRED EMBODIMENTS

Those components that are identical from one figure to another are identified by the same symbols.

Figure 5:
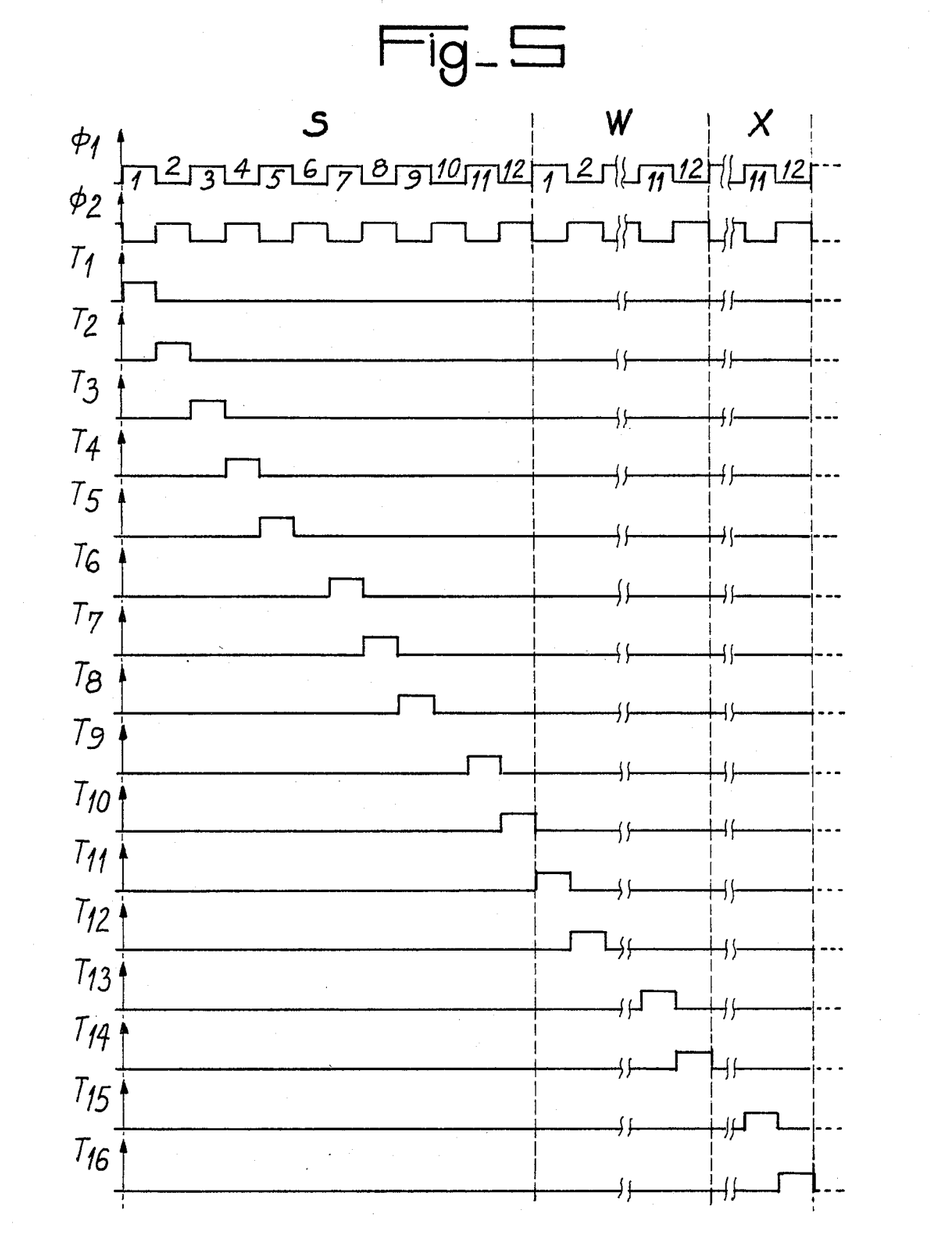
FIG. 5 represents voltage as a function of time for the control signals governing the operation of the device of FIG. 3.

In FIGS. 3 and 5, switches are represented as being of the mechanical type to simplify the drawing but they are, in the embodiments described, electronic switches whose associated arrows, generally represented by T, serve to identify their control signals which are positive or zero. These switches are open when their control signal is zero.

Figure 1:
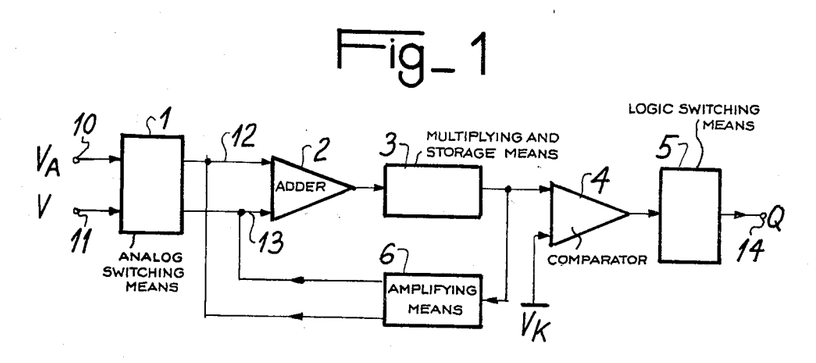
FIG. 1 is a schematic diagram of the device according to the invention.

In FIG. 1, analog switching means, 1, also having an attenuation function, has two input terminals, 10 and 11, receiving respectively signals $V_A$ and V, and two outputs connected respectively to the two input terminals, 12 and 13, of an adder, 2. The output of the adder, 2, is connected to multiplying and storage means, 3, whose output supplies in parallel the input of amplifying means, 6, and a first input of a comparator, 4, a second input of which receives a d.c. voltage $V_k$. The output of comparator 4 is connected to an output terminal, 14, supplying a signal, Q, via logic switching means, 5. The amplifying means 6 has two outputs respectively connected to the two input terminals 12 and 13 of adder 2.

Signals $V_A$ and V are respectively a variable voltage to be coded an a d.c. reference voltage, while the signal Q is a binary signal.

The principle of serial type analog-digital coding is as follows. A reference voltage which shall be called $V_R$ (to distinguish it from the preceding reference voltage which does not have the same function, as will be seen below) is quantified as a number of quanta equal to the number of states of the binary word that is to represent the coded voltage. As each quantum corresponds to a state of the binary word, the number of quanta is a function of the number of bits desired for the binary word. When coding in a binary word $Q_b$ having 4 bits, the maximum (or full scale) voltage that can be coded is equal to the voltage $V_R-(1/16)V_R$, i.e. $V_R$ less one quantum, and corresponds to $Q_b=1111$, the half scale voltage $V_A=V_R/2$ corresponds to $Q_b=1000$, the quarter scale voltage $V_A=V_R/4$ corresponds to $Q_b=0100$, and so on. The voltage for coding is therefore a fraction of the reference voltage and can be expressed by the product of voltage $V_R$ and the significance of the corresponding binary word $Q_b$ (expressed as a sixteenth of the voltage $V_R$ for a 4 bit code).

In order to obtain the binary word $Q_b$ it is necessary to establish the quantum of the voltage $V_R$ to which voltage $V_A$ is equal. This is achieved by successive comparisons between the voltage $V_A$ and fractions k (k<1) of voltage $V_R$. If $V_A-kV_R$ is positive, the corresponding bit is equal to "1", and to "0" if the contrary is true.

If the first comparison $V_A-(V_R/2)$ is positive, the first bit (or the most significant bit) is equal to "1"; if it is negative, this bit is equal to "0"; this is a test in relation to half scale. The second comparison will be $V_A-(V_R/4)$ (quarter scale test) if the preceding bit is equal to "1" and $V_A-(3V_R/4)$ (three quarter scale test) if it is equal to "0". If the result of this second comparison is positive, the second bit will be equal to "1" and if it is negative, this second bit will be equal to "0". It should be noted that determination of a given bit, other than the most significant bit, takes into account the status of the preceding bit.

The process continues up to the least significant bit.

This principle applies to linear coding but, for non-linear coding, the transmittance is linear in parts, being composed of p segments (p>0). It is first of all necessary to code the different segments of this transmittance (after determining, if applicable, the sign bit). In order to code $2^n$ segments, n bits are used, for example n=3 for 8 segments. A detailed account of the coding of these segments will be given below. Next, it is necessary to code the different quanta of each segment linearly according to the method described above. The analog switching means 1 and the adder 2 enable the alternate injection into the multiplying and storage means 3 of voltages $V_A$ and $k_1V$, via terminal 12, and of a voltage $k_2V$ via terminal 13. Similarly, a voltage $k_3(V_A+k_4V)$ ($k_1$, $k_2$, $k_3$ and $k_4$ being positive or negative integral or fractional coefficients) can be injected by means of amplifying means 6 and adder 2. The latter voltage is the one stored, during a preceding operation, in multiplying and storage means 3 and then amplified by amplifying means 6.

Certain of these stored voltages make it possible to determine the successive bits of the quantum of a segment (in linear code) that have significance ratios of 2; consequently, the successive voltages injected by the adder for each bit must also have a ratio of 2, which will be obtained by the multiplication function of means 3. The signals supplied by means 3 are then compared, at a voltage $V_k$, in comparator 4, which supplies a logic signal "1" if the difference between these signals and the voltage $V_k$ is positive, and a logic signal "0" if the contrary is true. It should be noted that the function of voltage $V_k$ is to compensate for a bias voltage of the multiplication and storage means 3. These logic signals are transmitted to terminal 14 via logic switching means 5 which furnish the binary signal Q representing the values of the successive bits in the binary word corresponding to the voltage coded, starting with the most significant bit.

In the case of linear coding, on the basis of the method described above enabling one bit to be determined in relation to the preceding one, it suffices to add algebraically a fraction of the reference voltage to the voltage previously stored; for this purpose, the analog switching means 1 must effect this algebraic addition and the amplifying means 6 must have a gain $k_3$ of zero.

In the case of non-linear coding, the gain $k_3$ will be non-zero and will be used to determine the segment to which the voltage for coding belongs.

Figure 2:
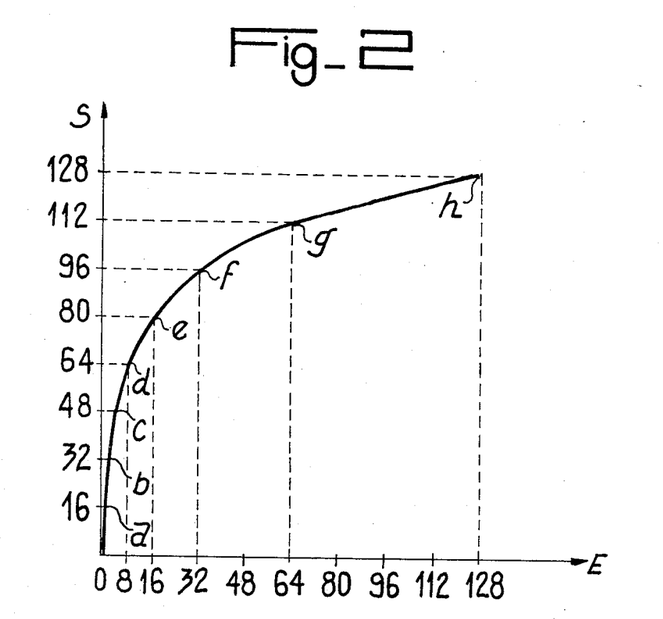
FIG. 2 is a compression curve for the law A.

FIG. 2 represents, for positive output values S and output values E, a non-linear transmittance $S=F(E)$ according to the law A, which is the most common compression law in Europe. The real amplitudes E are given on the abscissa, while the compressed amplitudes S are shown on the ordinate axis. The E axis is graduated according to quanta in conformity with the standards of the CCITT (International Telegraph and Telephone Consultative Committee), quanta whose number for the positive and negative portion of the axis of E is equal to 128. For the sake of convenience, the S axis is graduated using an identical scale from 0 to 128, the value 128 having been attributed to the maximum value of S, and a graduation having the same length on both axes.

The total curve is naturally symmetrical in relation to the zero. Only the positive portion is represented. It is composed of 8 segments of a line, with the slope of each segment representing half of the slope of the preceding segment, except in the case of the two first segments, Oa and ab, which are co-linear.

The points common to two succeeding segments have the following values on the abscissae and ordinate respectively: a: 1 and 16; b: 2 and 32; c: 4 and 48; d: 8 and 64; e: 16 and 80; f: 32 and 96; g: 64 and 112; h: 128 and 128.

7 bits are required in order to code 128 quanta; in the present case of an input signal with two polarities, a sign bit with the value "1" is added thereto for a positive signal, and a sign bit with the value "0" for a negative signal.

Coding of the different segments of this transmittance, which requires 3 bits, is as follows: $Oa=000$; $ab=001$; $bc=010$; $cd=011$ and so on up to $gh=111$. The sixteen quanta of each segment are then coded linearly with 4 bits in the way shown above.

In FIG. 3, the input terminal 10, receiving the analog signal for coding $V_A$, is connected to an input, 12, ("+" terminal) of an adder 2, via a switch, 30, actuated by a signal $T_1$. Terminal 11 receiving a reference signal V with a value of $3V_R$ is connected to earth via four series connected resistors, $R_1$, $R_2$, $R_3$ and $R_4$, whose values are such that $R_1=4R_4=8R_2=8R_3$. The reference voltage is used for coding the different segments and for the linear coding of the quanta of each of them. This makes it possible to obtain at terminal 15 common to resistors $R_1$ and $R_2$ a reference signal with a value $V_R$, at terminal 16, common to resistors $R_2$ and $R_3$, a reference signal with a value $\frac{3}{4}V_R$ and, on terminal 17 common to resistors $R_3$ and $R_4$, a reference signal with a value $\frac{1}{2}V_R$. The reference signals with values $3V_R$, $V_R$, $\frac{3}{4}V_R$ and $\frac{1}{2}V_R$ are connected respectively to the terminal, 12, of the adder 2, via switches 32, 34, 36 and 38, controlled respectively by signals $T_{22}$, $T_{24}$, $T_{26}$ and $T_{28}$. These reference signals are also connected to input "−", 13, of adder 2, respectively via switches 33, 35, 37 and 39; these switches are respectively controlled by signals, $T_{23}$, $T_{25}$, $T_{27}$ and $T_{29}$. In addition, a switch, 31, controlled by the signal $T_1$ serves to connect terminal 13 to earth. This assembly of switches and resistors in association with the "+" and "−" terminals of the adder 2, enables the above-mentioned coefficients $k_1$ and $k_2$ to be obtained.

The output of adder 2 is connected to the multiplication and storage means, 3, comprising in series a charge transfer device (abbreviated to CTD) composed of five series connected zones, 50, 51, 52, 53 and 54, and a reading device, 9. The CTD is controlled by a clock with two phases, $\Phi_1$ and $\Phi_2$, and the reading device is controlled by a reading clock $\Phi_L$.

The output of the reading device 9 supplies in parallel the input of the amplification means, 6, and a first "+" input of a comparator, 4, a second input of which receives a voltage $V_k$. The amplification and switching means, 6, comprise a controlled gain amplifier, 8, controlled by signals $T_{32}$, $T_{33}$, $T_{34}$ and $T_{35}$. The latter enable gains of an arithmetical value of $\frac{1}{2}$, $\frac{3}{4}$, 1 and 3 to be obtained respectively. This controlled gain amplifier, 8, is an operational amplifier whose negative feedback resistance is partially shunted by switches controlled by signals $T_{32}$ to $T_{35}$. The output of this controlled gain amplifier 8 is connected to the terminal 12 of the adder 2 via a switch, 40, controlled by a signal $T_{30}$, and to the terminal 13 of the same adder via a switch, 41, controlled by a signal, $T_{31}$. The assembly constituted by the amplification means 6 and adder 2 enables the coefficients $k_3$ and $k_4$ mentioned above to be obtained.

The output signal of comparator 4 controls the logic switching means, 5, comprising logic circuits, 55 to 64. The output of the comparator is connected to a "data" input, 23, of a D type of asynchronous multivibrator, 55, and to a first input of an AND-gate with two inputs, 56, and to a first complemented input of an AND-gate with two inputs, 57. The multivibrator 55 also receives a signal $T_2$ at a "clock" input and the signal $T_1$ at a "set to 1" input; this multivibrator has two outputs, 18 and 19, furnishing respectively signals $Q_S$ and $\overline{Q}_S$. The two AND-gates 56 and 57, receive respectively at their second inputs signals $Q_S$ and $\overline{Q}_S$ and have their outputs connected respectively to the two inputs of an OR-gate, 58, the output of which is connected to a "data" input, 24, of an asynchronous multivibrator, 59, of the D type. The multivibrator 59 receives, at a "clock" input, the signal $\Phi_L$ and, at a "zero-set" input, the signal $T_1$; the output terminals 14 and 20 of this multivibrator supply signals Q and $\overline{Q}$ respectively. The output terminal 14 is connected to a "data" input, 25, of a shift register composed of three multivibrators, 60, 61 and 62 of the D asynchronous type and connected in series. This register also receives a signal $T_{36}$ at a "clock" input; the inverse outputs of each multivibrator of this register are respectively connected to the three first inputs of an AND-gate, 63, having four inputs, the fourth input of which receives a signal $T_{12}$. The output of AND-gate 63 is connected to a "data" input, 26, of a multivibrator, 64 of the asynchronous D type. The multivibrator 64 receives, at a "clock" input, the signal $T_{12}$ and, at a "set to zero" input, the signal $T_1$; this multivibrator furnishes respectively signals $\alpha$ and $\overline{\alpha}$ to output terminals, 21 and 22.

A sequencing generator, 7, generates from a clock signal H, the signals $\Phi_1$, $\Phi_2$ and $\Phi_L$ as well as control signals $T_1$ to $T_{21}$.

Before explaining the operation of the coder in FIG. 3, it is necessary to detail the structure of the CTD as well as describe the control signals.

Figure 4:
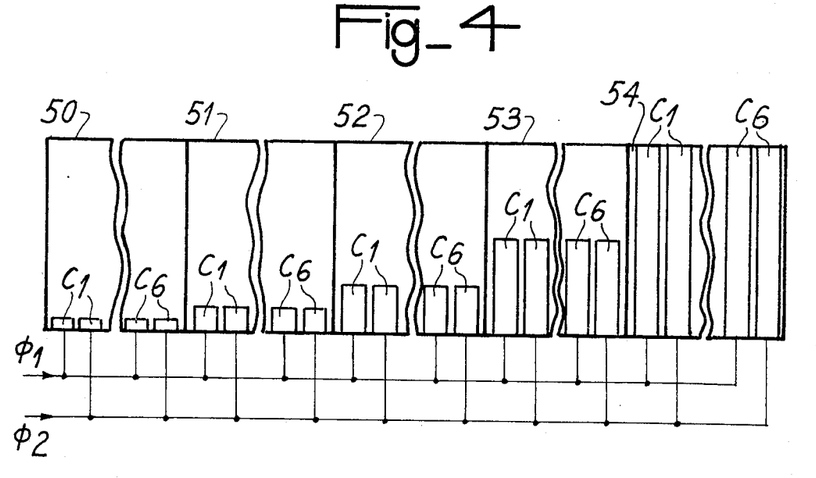
FIG. 4 is a detailed drawing of a component of FIG. 3.

FIG. 4 shows an N channel CTD, composed of five zones, 50 to 54, each comprising 6 cells $C_1$ to $C_6$. Each cell comprises two electrodes respectively controlled by signals $\Phi_1$ and $\Phi_2$ which enable the charges to be transferred from one electrode to another. To simplify the diagram, only the working surface of the electrodes has been illustrated. This working surface must be weighted from one zone to the next but, as the electrodes are identical in width it suffices to weight their lengths. The lengths have a ratio of two to one from one zone to the next; this is equivalent to multiplication factors of 1 for zone 50, 2 for zone 51, 4 for zone 54, and so on.

This method of weighting is known and described in the article "Transversal Filtering Using Charge-Transfer Devices" published by Dennis D. BUSS et al. in the IEEE review; Journal of Solid State Circuits, volume SCB, No. 2 of April 1973.

FIG. 5 represents the signals $\Phi_1$ and $\Phi_2$, in phase opposition and with the same recurrence frequency as the clock signal H, as well as the control signals $T_1$ to $T_{16}$. To enable the latter to be identified, the states of signal $\Phi_1$ have been numbered from $S_1$ to $S_{12}$, then from $W_1$ to $W_{12}$ and so on. The signals, $T_1$ to $T_{10}$, and certain of their combinations, which will be explained later on, enable the sign of the voltage for coding to be determined, hence a corresponding bit S, and the segment of the law A in which this voltage is located, hence the corresponding bits A, B and C. They also enable charges corresponding to these bits to be injected underneath the cells $C_1$ to $C_6$ of zone 50 of the CTD (FIG. 4). Signals $T_{11}$ and $T_{12}$ make it possible to establish whether the voltage for coding is in the first segment Oa or in segment ab (of FIG. 2), since, because, these segments being co-linear, the linear coding for segment Oa will be different from the linear coding for the other segments. This linear coding of the different segments is effected with four bits (16 quanta for each segment) which shall be called W, X, Y and Z. The signals $T_{13}$ and $T_{14}$ enable the most significant bit of the linear coding W to be determined and registered; in the same way, signals $T_{15}$ and $T_{16}$ have the same function for the bit of the following significance, X. In order to simplify FIG. 5, signals $T_{17}$ and $T_{18}$, as well as $T_{19}$ and $T_{20}$, have not been represented, but they have respectively the same function as signals $T_{15}$ and $T_{16}$, in determining bits Y and Z of the linear code.

The other signals are combinations of the preceding signals and other signals supplied by the device of FIG. 3. They are given by the following logic equations:

$$T_{21} = T_{13} + T_{15} + T_{17} + T_{19}$$

$$T_{22} = \overline{Q} \cdot Q_S \cdot T_6$$

$T_{23} = \overline{Q} \cdot \overline{Q}_S \cdot T_6$ $T_{24} = \overline{Q}_S \cdot T_3 + \overline{Q} \cdot Q_S \cdot T_9 + T_{21} \cdot Q \cdot \overline{Q}_S + T_{21} \cdot \overline{Q} \cdot Q_S \cdot a$ $T_{25} = Q_S \cdot T_3 + \overline{Q} \cdot \overline{Q}_S \cdot T_9 + T_{21} \cdot Q \cdot Q_S + T_{21} \cdot \overline{Q} \cdot \overline{Q}_S \cdot a$ $T_{26} = Q \cdot \overline{Q}_S \cdot T_6$ $T_{27} = Q \cdot Q_S \cdot T_6$ $T_{28} = T_{21} \cdot \overline{a} \cdot Q_S \cdot \overline{Q} + T_9 \cdot \overline{Q}_S \cdot Q$ $T_{29} = T_{21} \cdot \overline{a} \cdot \overline{Q}_S \cdot \overline{Q} + T_9 \cdot Q_S \cdot Q$ $T_{30} = \overline{Q} \cdot (T_5 + T_8)$ $T_{31} = Q \cdot (T_5 + T_8)$ $T_{32} = Q \cdot T_8$ $T_{33} = Q \cdot T_5$ $T_{34} = \overline{Q} \cdot T_8$ $T_{35} = \overline{Q} \cdot T_5$ $T_{36} = T_5 + T_8 + T_{11}$ $\Phi_L = T_2 + T_4 + T_7 + T_{10} + T_{14} + T_{16} + T_{18} + T_{20}.$ It should be noted that the control signal $\Phi_L$ of reading device 9 in FIG. 3 is synchronous, when it is non-zero, with signal $\Phi_2$ of FIG. 5 according to the above logic equation.

All these signals are logic signals with two states: "0" and "1".

In addition, the CTD comprises conventional input and output elements, not represented, including an input control electrode which receives the output signal of the adder 2.

In order for injection of the charges in the CTD to be in a linear zone, the input control electrode receives a bias voltage $V_K$ and this is this voltage which is applied at the "−" input of comparator 4. This bias voltage also enables positive or negative voltages to be applied to the control electrode.

Detailed operation of the device of FIG. 3 is as follows. During state $S_1$ of signal $\Phi_1$ (FIG. 5), the control signal $T_1$ closes switches 30 and 31 connecting terminal 13 of the adder 2 to earth via switch 31, and enabling the voltage for coding $V_A$ to be applied to the input control electrode of the CTD via the adder 2 and the switch 30. The signal $T_1$ sets the outputs Q and $\alpha$ of multivibrators 59 and 64 to "0" and the output $Q_S$ of multivibrator 55 to "1". Simultaneously, signal $\Phi_1$ enables a quantity of charges proportional to the voltage $V_A$ to be injected beneath the first electrode of cell $C_1$ in zone 50 of the CTD. During state $S_2$ (FIG. 5), the signals $\Phi_1$ and $\Phi_2$ enable charges to be transferred from the first electrode to beneath the second electrode of cell $C_1$, and, as signals $\Phi_2$ and $\Phi_L$ are in state "1" (because $\Phi_L = T_2 + "0" = T_2 = "1"$ according to the logic equation above and FIG. 5), they authorize reading of the charges of the CTD by the reading device, 9. The signal read, which has a value of $V_A + V_K$, is compared with the voltage $V_K$ in the comparator 4 which gives a state "1" if $V_A$ is positive and a state "0" if $V_A$ is negative. This logic state is reproduced, at the output terminal 18 of the multivibrator 55 (supplying the signal $Q_S$) and at the output terminal 14 of the multivibrator 59 (supplying the signal Q), via the gates 56 and 58 because $Q_S = $ "1" during state $S_2$, respectively, during the trailing edges of the signal $T_2$ and the signal $\Phi_L$ (clock signals of these multivibrators). The sign bit S thus occurs at terminal 18 and remains there throughout the coding; it therefore also occurs at the output terminal 14 which is that of the coder output. After bit S, bits A, B and C are determined and these bits enable the segments of the compression curve (FIG. 5) to which the voltage to be coded belongs to be determined.

The voltages expressed in quanta in FIG. 2 will be related to a reference voltage $V_R$ equal to 8 quanta: thus on the axis of abscissa $V_a = \frac{1}{8} V_R$, $V_b = \frac{1}{4} V_R$, $V_c = \frac{1}{2} V_R$, $V_d = V_r$ and so on up to $V_h = 16 V_R$. Bit A will be respectively equal to "1" or "0" if voltage $V_A$ is greater than or less than $V_d$.

Similarly, bit B, in the case of $A = $ "1", will be equal to "1" or "0" respectively depending on whether the voltage $V_A$ is greater than or less than voltage $V_f$. If $A = $ "0", the comparison will be effected in relation to the voltage at point b (FIG. 2). The same procedure will apply to bit C.

The process of the corresponding operations is as follows for bit A: unde the first electrode of cell $C_1$, in zone 50 of the CTD, during the state $S_3$ is injected a quantity of charges that is proportional to the voltage $-V_R$ is the sign bit S is equal to "1", and to $+V_R$ if this is not the case, respectively via switches 35 and 34 controlled respectively by signals $T_{25}$ and $T_{24}$ (owing to the term $T_3 \cdot Q_S$ or $T_3 \cdot \overline{Q}_S$ of their logic equation).

Simultaneously, the signals $\Phi_1$ and $\Phi_2$ enable the charges to be transferred from the second electrode of $C_1$ to beneath the first electrode of $C_2$.

During the state $S_4$, the charges are displaced by the signals $\Phi_1$ and $\Phi_2$ and are placed underneath the second electrodes of cells $C_1$ and $C_2$ (FIG. 4).

Simultaneously, as signal $\Phi_L$ is in state "1" (because $\Phi_L = T_4 + "0" = T_4 = "1"$ according to its logic equation and FIG. 5), it enables reading of the charges of the CTD by the reading device 9. The signal read, the value of which is $V_A \pm V_R + V_K$, is compared with the voltage $V_k$ in the comparator 4, which gives a state "1" if $V_A \pm V_k$ is positive and a state "0" if this is not the case. This logic state is transmitted to the input of multivibrator 59 by the gates 56 and 58 if the sign bit S is equal to "1", and the inverse of this state is transmitted by the gates 57 and 58 to the input of the same multivibrator, if the bit S is equal to "0". In the second case, the output signal of the comparator 4 is inverted, as the voltage $V_A$ is negative, and the result of the comparison has a significance which is inverse to that of the first case (in the second case, if the output signal of the comparator 4 is in state "1", this means that bit A is in state "0").

In the two cases, the corresponding logic state is reproduced under the terminal 14 of the multivibrator 59, at the time of the trailing edge of the signal $\Phi_L$ (or of the signal $T_4$ in the present case).

In order to determine bit B, it is necessary to compare the voltage $V_A$ to the voltage $4V_R$ if bit A is in state "1", and with voltage $V_R/4$ if the contrary is true. As this comparison is effected during a reading of the CTD, the algebraic sum of the new charges injected and of the charges already present must correspond to a voltage read equal to $V_A \pm 4V_R$ in the first case and to $V_A \pm \frac{1}{4} V_R$ in the second case. But it is also possible to effect the above comparisons respectively in the forms $\frac{1}{4} V_A \pm V_R$ and $4V_A \pm V_R$. In FIG. 3, the latter solution has been chosen.

These algebraic voltage sums are effected by applying respective voltages $-\frac{3}{4}(V_A \pm V_R) \pm \frac{3}{4}V_R$ and $3(V_A \pm V_R) \pm 3V_R$ to the input control electrode of the CTD. These operations are effected in two stages; first of all, $-\frac{3}{4}(V_A \pm V_R)$ or $3(V_A \pm V_R)$ is injected, according to the case, and then $\pm \frac{3}{4}V_R$ or $\pm 3V_R$ according to the case. This therefore necessitates two states $\Phi_1$ at "1" which will be separated by a state $\Phi_2$ at "1" only used for charge transfer in the CTD.

During the state $S_5$ of the signal $\Phi_1$, the voltage $V_A \pm V_R$, present at the output of the reading device 9, is applied to the input of the variable gain amplifier, 8, whose gain, $k_3$, controlled by the signals $T_{33}$ or $T_{35}$ (depending on the case) will be respectively equal to $\frac{3}{4}$ or 3. The output signal of this amplifier is applied to the terminal 12 for a positive equivalent gain and to the terminal 13 for a negative equivalent gain, via the corresponding switches 40 and 41 (respectively controlled by the signals $T_{30}$ and $T_{31}$). The adder 2 then transmits the voltage received to the input control electrode of the CTD which functions as in the case of injection of voltage $\pm V_r$: injection of new charges and transfer of the charges already present from one electrode to another.

During state $S_6$, the charges that are present beneath the electrodes are transferred from one electrode to the succeeding one.

During state $S_7$, one of the signals, $T_{22}$, $T_{23}$, $T_{26}$ and $T_{27}$, controlling the corresponding switches 32, 33, 36 and 37, enables one of the voltages, $+3V_R$, $-3V_R$, $+\frac{3}{4}V_R$ and $-\frac{3}{4}V_R$ to be applied to the input control electrode of the CTD, via the adder 2, depending on whether $V_A$ is positive or negative and whether bit A is equal to "1" or to "0". Simultaneously, the charges present in the CTD are transferred.

During state $S_8$, the charges are again transferred and are read by the reading device 9 controlled by the signal $\Phi_L$ ($\Phi_L$="0"+$T_7$+"0"=$T_7$="1" according to the logic equation of $\Phi_L$ and FIG. 5). The output voltage of this device is then compared with the voltage $V_k$ in comparator 4 and, as before, the bit B occurs at terminal 14 of the multivibrator 59.

Operation is the same in the case of bit C and the process takes place during states $S_9$, $S_{10}$, $S_{11}$ and $S_{12}$ of signal $\Phi_1$.

There is a special case if the bits A, B and C are equal to "0" in which case the voltage for coding $V_A$ is located on segment Oa. As linear coding in sixteen quanta will be different, it is necessary to detect this combination of bits A, B and C. This is the function of the logic circuits 60 to 64. The shift register, composed of the three multivibrators 60, 61 and 62 and controlled by the clock signal $T_{36}$, successively registers bits A, B and C respectively during states $S_5$, $S_9$ and $W_1$ via its "information" input 25. The inverse output signals of each multivibrator are transmitted to the "information" input 26 of multivibrator 64 via the AND-gate 63, when the signal $T_{12}$ is in state "1" i.e. during the state $W_2$. The state thus transmitted will be "1" only if bits A, B and C are in "0" state. This particular case will be reproduced at the terminal 21 of multivibrator 64 by the signal $\alpha$ which will change to "1" with the trailing edge of the clock signal $T_{12}$.

During state $S_{12}$, the charges corresponding respectively to the bits C, C, B, B, A and S are stored under the second electrodes of cells $C_1$ to $C_6$ in zone 50 of the CTD (FIG. 4) controlled by the signal $\Phi_2$.

During states $W_1$ to $W_{12}$, the charges stored beneath the electrodes of zone 50 of the CTD (FIGS. 4 and 5) are respectively transferred beneath those of zone 51; as the working surface of the electrodes is doubled, any corresponding voltage that is read by reading device 9 will be doubled.

The duration of the latter states is also used to determine, in linear coding, the most significant bit W.

In order to determine the bit W, it is necessary to proceed as in the case of linear coding.

If, for example, the bits A, B and C are in state "1", the corresponding point on the compression curve in FIG. 2 is point g, and the bit W is obtained by comparing the voltage $V_A$ with the voltage corresponding to the middle of segment gh (that is to say by carrying out the half-scale test).

The comparison to be effected will therefore be $V_A - 96$ quanta i.e. $V_A - 12V_R$ (as the voltage $V_R$ is selected as equal to 8 quanta) that is to say $2(\frac{1}{8}V_A - V_R) - V_R$ allowing for the term $2(\frac{1}{8}V_A - V_R)$ which is stored in zone 51 of the CTD (FIG. 4); the number 2 that is a factor of the term $(\frac{1}{8}V_A - V_R)$ is due to the fact that the ratio of the working surfaces of the electrodes of zones 50 and 51 of the CTD is 2:1.

If, for example, bits A and B are in state "1" and if bit C is in state "0", the corresponding point on the curve of FIG. 2 is point f, and, in this case, bit W is obtained by comparing voltage $V_A$ with the voltage corresponding to the middle of segment fg; this is done by effecting the comparison $V_A - 48$ quanta, or $V_A - 6V_R$, or again, $2(\frac{1}{8}V_A - V_R) + V_R/2$ for the same reason as above.

These operations are carried out in the above two zones by injecting respectively into zone 50 of the CTD a voltage $-V_R$ and a voltage $+V_R/2$.

These voltages are applied to the input control electrode of the CTD during the state $W_{11}$, via adder 2 and the respective switches 35 and 38.

During state $W_{12}$, the voltages corresponding to the charges stored in the CTD are read by the reading device 9 controlled by the signal $\Phi_L$. The output voltage of this device is treated in the same way as before (in the case of bits A, B and C), and supplies the bit W to terminal 14 of the multivibrator 59 during the trailing edge of signal $\Phi_L$.

During states $X_1$ to $X_{12}$, the charges stored under cells $C_1$ to $C_{16}$ in zone 51 of the CTD (FIG. 4) are respectively transferred beneath those of zone 52, and those stored beneath cells $C_1$ to $C_6$ of zone 50 are respectively transferred beneath those of zone 51.

In order to determine bit X, it is necessary to carry out the quarter or three-quarter scale test in accordance with the linear coding method described above.

But, in the case of bits X, Y and Z of the linear coding, experience has shown and calculations have confirmed that it suffices to apply to the input control electrode of the CTD (zone 50) a voltage $\pm V_R$ (+ or − depending on whether the preceding bit is equal to "0" or "1") if this bit C is equal to "1", and a voltage $+V_R/2$ if bit C is equal to "0". However, in the particular case wherein bits A, B and C are zero, a voltage $\pm V_R$ must be applied.

When coding of voltage $V_A$ is completed, the charges corresponding to the bits S, A and C are stored in zone 54 of the CTD (FIG. 4), while those corresponding to bit W and stored in zone 53, those corresponding to bit X in zone 52, those corresponding to bit Y in zone 51 and those corresponding to bit Z in zone 50.

On the basis of the functioning of this coder according to the compression law A and of its design (FIGS. 3 and 4), the design and operation of a linear code can be deduced as follows.

Zones 50 to 54 of the CTD only have one cell each since the bits A, B and C are no longer used. The amplifying means 6, as they are used above only for the coding of bits A, B and C, are now superfluous.

One part of the logic switching means 5 including the logic operators 60 and 64 enabling the combination of bits A, B and C in "0" state to be detected are also to be dispensed with. Switches 32, 33, 36 and 37, as well as their respective control signals, are also superfluous.

Certain signals are no longer used for this linear coding, these are the following: signals $T_3$ to $T_{12}$ for determining bits A, B and C, signals $T_{22}$, $T_{23}$, $T_{26}$, $T_{27}$, $T_{30}$ and $T_{31}$ controlling the switches already discarded, signals $T_{32}$ to $T_{35}$ for controlling the variable gain amplification means 8, the clock signal $T_{36}$ of the shift register composed of multivibrators 60 to 62. It should also be noted that signals $\Phi_2$ and $\Phi_L$ become identical.

Figure 6:
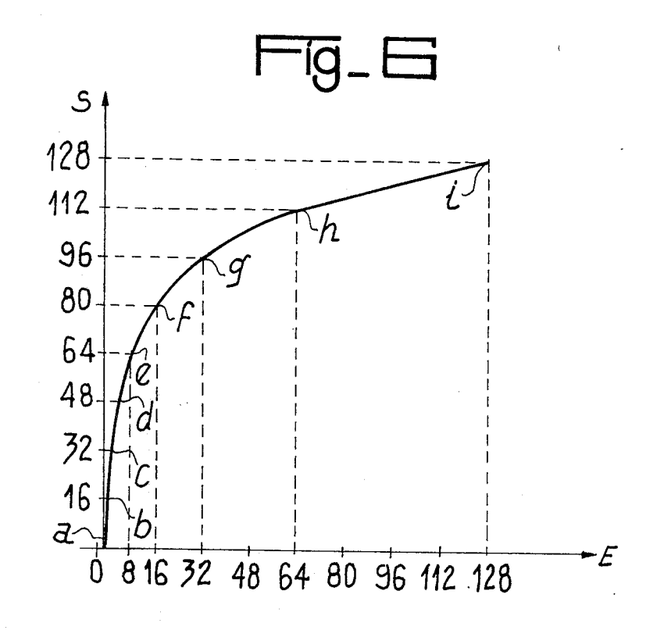
FIG. 6 is a compression curve according to the law $\mu$.

The device according to FIG. 1 also allows other compression laws to be obtained, in particular the law $\mu$, which is very common to North America, which is represented in FIG. 6.

FIG. 6 represents, for, positive input values E and output values S, a transmittance $S=F(E)$ which is non-linear, in accordance with the $\mu$ compression law. The real amplitudes E are represented on the axis of the abscissae, while the compressed amplitudes S are given on the ordinate axis. The E axis is graduated according to standardized quanta (in conformity with the standards of the CCITT) whose number for each polarity of E is equal to 128. These graduations are the same as in the case of law A with a zero displaced by 33 standardized units. The ordinate axis has been graduated in the same way as in the case of the law A.

As in the case of law A, the total curve is symmetrical in relation to the zero. The positive portion, which is all that it is necessary to describe, comprises 9 segments of a line; the slope of each segment is half that of the preceding element.

The points, a, b, c, d, e, f, g, h, i, common to two succeeding segments, have the following respective abscissae and ordinate values: a: 34/64 and 1; b: 1 and 16; c: 2 and 32; d: 4 and 48; e: 8 and 64; f: 16 and 80; g: 32 and 96; h: 64 and 112; i: 128 and 128.

The last eight are coded with three bits. Their coding is identical to that of the law A (000 for the segment ab and so on). Each segment is also coded with four bits (sixteen quanta per segment).

Figure 7:
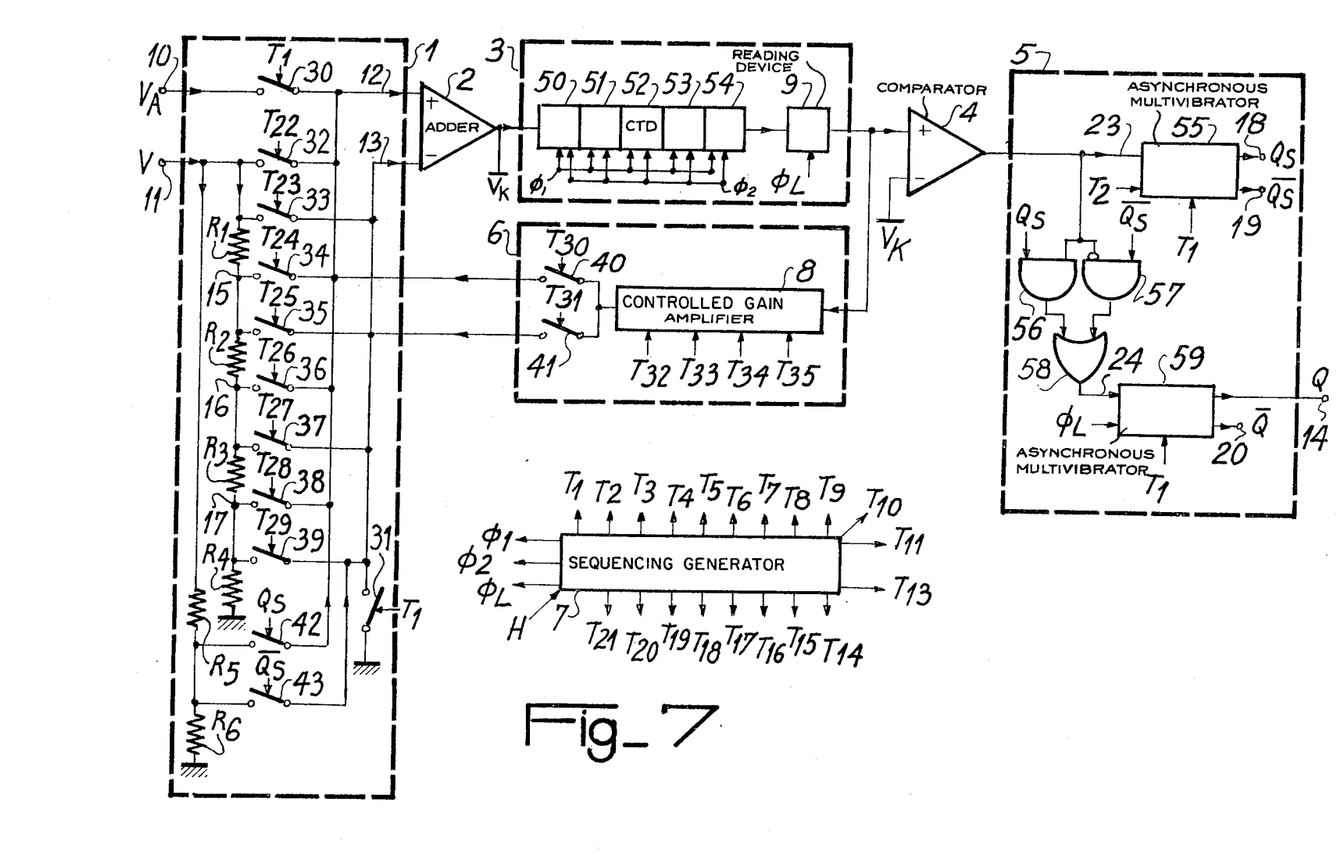
FIG. 7 is a diagram of a second embodiment of a device according to the invention.

The coding of this law is effected using the circuits of the FIG. 7.

In FIG. 7, the analog switching means, 1, the adder, 2, the multiplication and storage means, 3, the amplifier means 6, the comparator 4 and the logic switching means, 5, are present as in FIG. 3 and are connected in the same way; in addition, all these sub-assemblies are structurally identical, apart from the following differences.

The analog switching means, 1, differ from those of FIG. 3 in that they comprise, in addition to the components of the latter, a resistive divider composed of two series connected resistors, $R_5$ and $R_6$, connecting the input terminal 11 to earth. These resistors have values such that their common terminal, 23, supplies a reference voltage with a value $(17/256)V_R$ which is applied to terminals 12 and 13 of the adder 2 via corresponding switches, 42 and 43, respectively controlled by signals $Q_S$ and $\overline{Q}_S$. The logic switching means, 5 are different from those in FIG. 3 in that logic operators 60 to 64 and control signals $T_{12}$ and $T_{36}$ are discarded.

This device functions in a way analogous to that of the device in FIG. 3, with the following differences. As law $\mu$ does not comprise co-linear segments, it does not require detection of the combination "000" of the bits A, B and C (hence the elimination of logic operators 60 to 64).

Consequently, certain switch control signals are modified; these are as follows:

$T_{24} = \overline{Q}_S \cdot T_3 + \overline{Q} \cdot Q_S \cdot T_9 + T_{21} \cdot Q \cdot \overline{Q}_S$ $T_{25} = Q_S \cdot T_3 + \overline{Q} \cdot \overline{Q}_S \cdot T_9 + T_{21} \cdot Q \cdot Q_S$ $T_{28} = T_{21} \cdot Q_S \cdot \overline{Q} + T_9 \cdot \overline{Q}_S \cdot Q$ $T_{29} = T_{21} \cdot \overline{Q}_S \cdot \overline{Q} + T_9 \cdot Q_S \cdot Q$ In addition, the displacement of the zero of the axis of the abscissae (by a value of $(17/256)V_R$) of the curve of law $\mu$ (FIG. 6) in relation to the curve of law A results in the application to the input control electrode of the CTD, during state $S_3$, of a voltage $-V_R+(17/256)V_R$ if the voltage to be coded $V_A$ is positive, and a voltage $+V_R-(17/256)V_R$ if the voltage $V_A$ is negative. The additional positive or negative voltage $(17/256)V_R$, in relation to the case of the law A, is transmitted respectively via the switch 42 and the adder 2, or via the switch 43 and the adder 2.

Injection of the voltages $k_zV$ and $k_3(V_A+k_4V)$ enabling determination of coding bits B and C, has been effected in two stages: that is to say in two semi-periods of the signal $\Phi_1$. However, it is possible to inject these voltages in a single operation insofar as the error resulting from the interaction of these two voltage sources is disregarded. An improvement can be made, when injecting in a single operation, by providing an adder at each output terminal of the analog switching means, 1. These adders then receive respectively at their "−" inputs one of the output signals of the means 1 and have their "+" inputs connected to earth.

The invention is not limited to the form of embodiment described and represented; in particular, the device can comprise variants.

It should be noted that these codings have been described as a function of curves of compression with 8 segments, but it is possible to deduce immediately therefrom from the structure necessary for compression curves comprising a number p of segments, characterized by the relationships $p=2^n$ if n is the number of bits the significance of which enables a segment of the curve of p segments to be determined. In this case a number M of bits is required, with $M=1+n+k$, wherein k is the number of bits whose significance makes it possible to determine a quantum of each segment, and 1 represents the bit coding the sign.

The structure of the CTD is then a function of M and comprises $k+1$ groups of m cells, one cell being constituted by q electrodes $q=2$ or 3. In order to apply a voltage to the input control electrode of the CTD in a single operation, $m=n+1$ cells ($n \geq 0$) will be needed and, in order to do so in two stages (counting from the second coding bit of the segment) 2n cells ($n \geq 0$) will be required.

If the law of compression is such that $2^n \geq p \geq 2^{n+1}$, $m=n+1$ cells will be required for injection in a single operation and $m=2(n+1)$ cells for an operation in two stages.

The different control signals of the CTD relate to an N channel charge transfer device, but the same result will be obtained with a P channel charge transfer device. In addition, if the coder described comprises a CTD controlled by a two-phase clock, it is within the grasp of one skilled in the art to replace it by a CTD controlled by a three-phase clock.

It should be noted that the value of the voltage $V_k$ is applied to the "−" terminal of the comparator 4 has not in practice the value $V_k$ but the value $k_5 V_K$ where $k_5$ is a factor dependent upon the amplification of reading means 9 and upon any compensations of shift voltage for the amplifers of these reading means.

An analog-digital coder according to the invention can be used, in particular, in systems for the transmission of information that requires said information to be digitalized.

Of course, the invention is not limited to the embodiments described and shown which were given solely by way of example.

What is claimed, is:

1. A non-linear analog-digital coder for encoding analog information in accordance with a law consisting of p linear segments, p being a positive integer, each of said segments being quantifed in at most $2^k$ quanta, each analog datum being encoded in a number of $M=1+n+k$ bits, wherein n is an and represents the number of bits whose value characterizes one of the p segments, with $2^n \leq p < {}^{n+1}$, k is a positive integer and represents the number of bits whose value characterizes a quantam of the segment determined by n, and 1 corresponds to a sign bit, said coder having an output and comprising:

analog switching means including a voltage divider, and having two inputs for receiving respectively said analog data and a first reference voltage, and two outputs;

an adder, responsive to said analog switching means and having two inputs respectively coupled to the two outputs of said analog switching means;

a CTD having an input respective to said adder and biased by a second reference voltage, said CTD having injection and series reading units made of $k+1$ groups of at least $2(n+1)$ cells among which 2n cells are weighted according to the same law as the slopes of said segments;

an analog comparator for comparing the output of said CTD reading units with said second reference voltage;

logic output means responsive to said comparator and having an output coupled to the output of said coder;

a controlled gain amplifier connected between said CTD reading unit and said analog switching means outputs for generating a signal related to the already coded part of the analog datum, the gain of said controlled gain amplifier being related to said already coded part of the analog datum; and sequencing means for operating said CTD and said controlled gain amplifier and for generating timing signals to said analog switching means and logic output means.

2. A non-linear coder according to claim 1 wherein said CTD is a two phase device.

3. A non-linear coder according to claim 1 wherein said CTD is a three phase device.

4. A non-linear coder according to claim 1 in which said controlled gain amplifier comprises an operational amplifier and switchable feedback resistors.

5. A non-linear coder according to claim 1 wherein said law is CCITT A law and said logic output means includes an n stage shift register for distinguishing between the first two segments of the coding law.

6. A non-linear analog-digital coder for encoding analog information in accordance with a law consisting of p linear segments, p being a positive integer, each of said segments being quantified in at most $2^k$ quanta, each analog datum being encoded in a number of $M=1+n+k$ bits, wherein n is an integer greater than −1 and represents the number of bits whose value characterizes one of the p segments, with $2^n \leq p < 2^{n+'}$, k is a positive integer and represents the number of bits whose value characterizes a quantum of the segment determined by n, and 1 corresponds to a sign bit, said coder having an output and comprising:

analog switching means including a voltage divider, and having two inputs for receiving respectively said analog data and a first reference voltage, and two outputs;

an adder, responsive to said analog switching means and having two inputs respectively coupled to the two outputs of said analog switching means;

a CTD having an input responsive to said adder and biased by a second reference voltage, said CTD having injection and series reading units made of $k+1$ groups of at least $n+1$ cells among which n cells are weighted according to the same law as the slopes of said segments;

an analog comparator for comparing the output of said CTD reading units with said second reference voltage;

logic output means responsive to said comparator and having an output coupled to the output of said coder;

a controlled gain amplifier connected between said CTD reading unit and said analog switching means outputs for generating a signal related to the already coded part of the analog datum, the gain of said controlled gain amplifier being related to said already coded part of the analog datum; and sequencing means for operating said CTD and said controlled gain amplifier and for generating timing signals to said analog switching means and logic output means.

7. A non-linear coder according to claim 6 wherein said CTD is a two phase device.

8. A non-linear coder according to claim 6 wherein said CTD is a three phase device.

9. A non-linear coder according to claim 6 wherein said controlled gain amplifier comprises an operational amplifier and switchable feedback resistors.

* * * * *